United States Patent
Duong et al.

(10) Patent No.: US 11,435,148 B2
(45) Date of Patent: Sep. 6, 2022

(54) COMPOSITE SPRING HEAT SPREADER

(71) Applicant: Raytheon Company, Waltham, MA (US)

(72) Inventors: Tuan L. Duong, Santa Barbara, CA (US); Eric Swanson, Santa Barbara, CA (US); Michael Hulse, Erie, CO (US); William Francis, Lyons, CO (US)

(73) Assignee: Raytheon Company, Waltham, MA (US)

( * ) Notice: Subject to any disclaimer, the term of this patent is extended or adjusted under 35 U.S.C. 154(b) by 98 days.

(21) Appl. No.: 16/813,420

(22) Filed: Mar. 9, 2020

(65) Prior Publication Data

US 2021/0278151 A1    Sep. 9, 2021

(51) Int. Cl.
| | | |
|---|---|---|
| *F28F 21/02* | (2006.01) | |
| *B32B 9/04* | (2006.01) | |
| *B23P 15/26* | (2006.01) | |
| *B32B 3/28* | (2006.01) | |
| *F28F 13/08* | (2006.01) | |

(52) U.S. Cl.
CPC ............. *F28F 21/02* (2013.01); *B32B 9/047* (2013.01); *B23P 15/26* (2013.01); *B23P 2700/10* (2013.01); *B32B 3/28* (2013.01); *F28F 13/08* (2013.01)

(58) Field of Classification Search
CPC .......... F28F 21/02; F28F 13/08; B32B 9/047; B32B 3/28; B23P 15/26
See application file for complete search history.

(56) References Cited

U.S. PATENT DOCUMENTS

| | | | | |
|---|---|---|---|---|
| 5,065,279 A | * | 11/1991 | Lazenby | ............. H01L 23/4985 361/720 |
| 6,043,981 A | * | 3/2000 | Markow | ............ H01L 23/4006 257/E23.084 |

(Continued)

FOREIGN PATENT DOCUMENTS

EP    2738804 A2    6/2014

OTHER PUBLICATIONS

International Search Report dated Feb. 4, 2021 in connection with International Patent Application No. PCT/US2020/057040, 3 pages.

(Continued)

*Primary Examiner* — Tho V Duong (57) ABSTRACT

An apparatus includes a first planar region having a first surface configured to contact a heat sink. The apparatus also includes at least one second planar region having a second surface configured to contact a surface of at least one heat generating component, the at least one second planar region being parallel to the first planar region and disposed in at least one plane that is offset from the first planar region. The apparatus further includes a plurality of flexure regions disposed at an angle or curved relative to the first planar region and the at least one second planar region. The plurality of flexure regions connect the at least one second planar region to the first planar region. The first planar region and the at least one second planar region are formed of at least a thermally conductive material and a stiffening material and the plurality of flexure regions are formed of at least the stiffening material.

20 Claims, 8 Drawing Sheets

(56) References Cited

U.S. PATENT DOCUMENTS

| | | | |
|---|---|---|---|
| 6,496,373 B1 | 12/2002 | Chung | |
| 6,504,720 B2* | 1/2003 | Furuya | F28D 15/0233 |
| | | | 361/689 |
| 6,542,371 B1 | 4/2003 | Webb | |
| 6,700,782 B1* | 3/2004 | Bopp | H01L 23/32 |
| | | | 24/453 |
| 6,746,768 B2 | 6/2004 | Greinke et al. | |
| 7,352,585 B2* | 4/2008 | Mandel | H01L 23/427 |
| | | | 257/E23.105 |
| 7,755,903 B2* | 7/2010 | Tsai | H01L 23/4093 |
| | | | 257/718 |
| 8,077,476 B2* | 12/2011 | Yasuda | H01L 23/4093 |
| | | | 174/16.3 |
| 10,458,716 B2 | 10/2019 | Hulse et al. | |
| 2002/0015288 A1 | 2/2002 | Dibene, II et al. | |
| 2007/0159799 A1 | 7/2007 | Dando, III et al. | |
| 2018/0306530 A1 | 10/2018 | Francis et al. | |

OTHER PUBLICATIONS

Written Opinion of the International Searching Authority dated Feb. 4, 2021 in connection with International Patent Application No. PCT/US2020/057040, 8 pages.

\* cited by examiner

COMPOSITE SPRING HEAT SPREADER

TECHNICAL FIELD

This disclosure is directed in general to heat dissipation in mechanical or electrical systems. More specifically, this disclosure relates to a composite spring heat spreader configured for dissipating thermal energy or "heat" from one or more heat generating components.

BACKGROUND

Many electrical components (such as those found in many electronic devices) consume large amounts of power and subsequently generate large amounts of thermal energy or heat as waste. To ensure proper cooling, electrical components are thermally coupled in various ways to a heat sink that receives and dissipates at least some of the thermal energy. Consistent thermal contact between the electrical component and the heat sink is important for heat transfer away from the electrical component, and corresponding reliable electrical component operation. Manufacturing variability of the heat generating component, heat sink, and any structures in between will result in variations in the gap between the heat generating component and heat sink. Therefore, to maintain consistent thermal contact, while considering manufacturing variability, compliant materials are often utilized to absorb assembly tolerances and maintain adequate thermal transfer contact from hot components to their corresponding heat sinks.

SUMMARY

This disclosure provides a composite spring heat spreader configured to transfer thermal energy or heat from one or more generating components.

In a first embodiment, an apparatus includes a first planar region having a first surface configured to contact a heat sink. The apparatus also includes at least one second planar region having a second surface configured to contact a surface of at least one heat generating component, the at least one second planar region being parallel to the first planar region and disposed in at least one plane that is offset from the first planar region. The apparatus further includes a plurality of flexure regions disposed at an angle or curved relative to the first planar region and the at least one second planar region. The plurality of flexure regions connect the at least one second planar region to the first planar region. The first planar region and the at least one second planar region are formed of at least a thermally conductive material and a stiffening material, and the plurality of flexure regions are formed of at least the stiffening material.

In a second embodiment, a system includes at least one heat generating component, a heat sink, and a heat spreader disposed between the at least one heat generating component and the heat sink. The heat spreader includes a first planar region having a first surface configured to contact the heat sink. The heat spreader also includes at least one second planar region having a second surface configured to contact a surface of the at least one heat generating component, the at least one second planar region being parallel to the first planar region and disposed in at least one plane that is offset from the first planar region. The heat spreader further includes a plurality of flexure regions disposed at an angle or curved relative to the first planar region and the at least one second planar region. The plurality of flexure regions connect the at least one second planar region to the first planar region. The first planar region and the at least one second planar region are formed of at least a thermally conductive material and a stiffening material, and the plurality of flexure regions are formed of at least the stiffening material.

In a third embodiment, a method includes providing at least one heat generating component on a substrate. The method also includes providing a heat sink. The method further includes placing a heat spreader between the at least one heat generating component and the heat sink. The heat spreader includes a first planar region having a first surface contacting the heat sink. The heat spreader also includes at least one second planar region having a second surface contacting a surface of the at least one heat generating component, the at least one second planar region being parallel to the first planar region and disposed in at least one plane that is offset from the first planar region. The heat spreader further includes a plurality of flexure regions disposed at an angle or curved relative to the first planar region and the at least one second planar region. The plurality of flexure regions connect the at least one second planar region to the first planar region. The first planar region and the at least one second planar region are formed of at least a thermally conductive material and a stiffening material, and the plurality of flexure regions are formed of at least the stiffening material.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1A through 5, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

As discussed above, compliant materials are often utilized in heat spreaders to account for assembly tolerances and maintain adequate thermal transfer contact from heat generating components to their corresponding heat sinks. For example, soft gap pad materials are sometimes used as compliant heat transfer materials. Copper beryllium springs and copper or graphite based thermal straps can also be utilized if there is adequate packaging space. Conventional thermal interface materials (TIMs), such as thermal grease, offer minimal to no compliancy and typically require design trades between thermal performance and tolerance absorption. For example, thermal grease will easily spread to conform to a particular shape and has high thermal performance. However, thermal grease exhibits poor elasticity, and generally will not return to an original shape, so it is not good at absorbing variable tolerances. Conversely, a gap pad can be highly elastic, deforming under compressive force but easily returning to its original shape when the force is removed. Thus, the gap pad can have large tolerance absorption. However, gap pads do not exhibit high thermal performance, which can create high thermal gradients between an electrical component and its paired heat sink. In addition, pressure sensitive components can easily be over-compressed by a gap pad, resulting in damage to the components.

To address these and other issues, the embodiments described in this disclosure provide a composite spring heat spreader that has higher thermal conductivity than gap pad materials while offering similar mechanical compliancy. The disclosed composite spring heat spreader integrates a high strain composite spring material with a thin, highly thermally conductive material. The high strain composite spring material includes a mechanical flexure region providing mechanical pressure while a thermally conductive material integrated into the structure provides the primary heat transfer path to a heat generating component and a heat sink, such as a cold plate. The composite spring heat spreader can be produced through standard composite manufacturing techniques with readily available materials. The composite spring heat spreader design may be tailored through modification of flexure regions or similar features and varying laminate architecture to meet thermal, heat generating component mounting pressure, and system level shock and vibration requirements. In some embodiments, the composite spring heat spreader can accommodate multiple heat generating components (including those with differing heights) with the incorporation of multiple thermal flexure regions.

It will be understood that embodiments of this disclosure may include any one, more than one, or all of the features described here. Also, embodiments of this disclosure may additionally or alternatively include other features not listed here. While the disclosed embodiments may be described with respect to electronic systems, these embodiments are also applicable in any other suitable systems or applications.

Figure 1A:
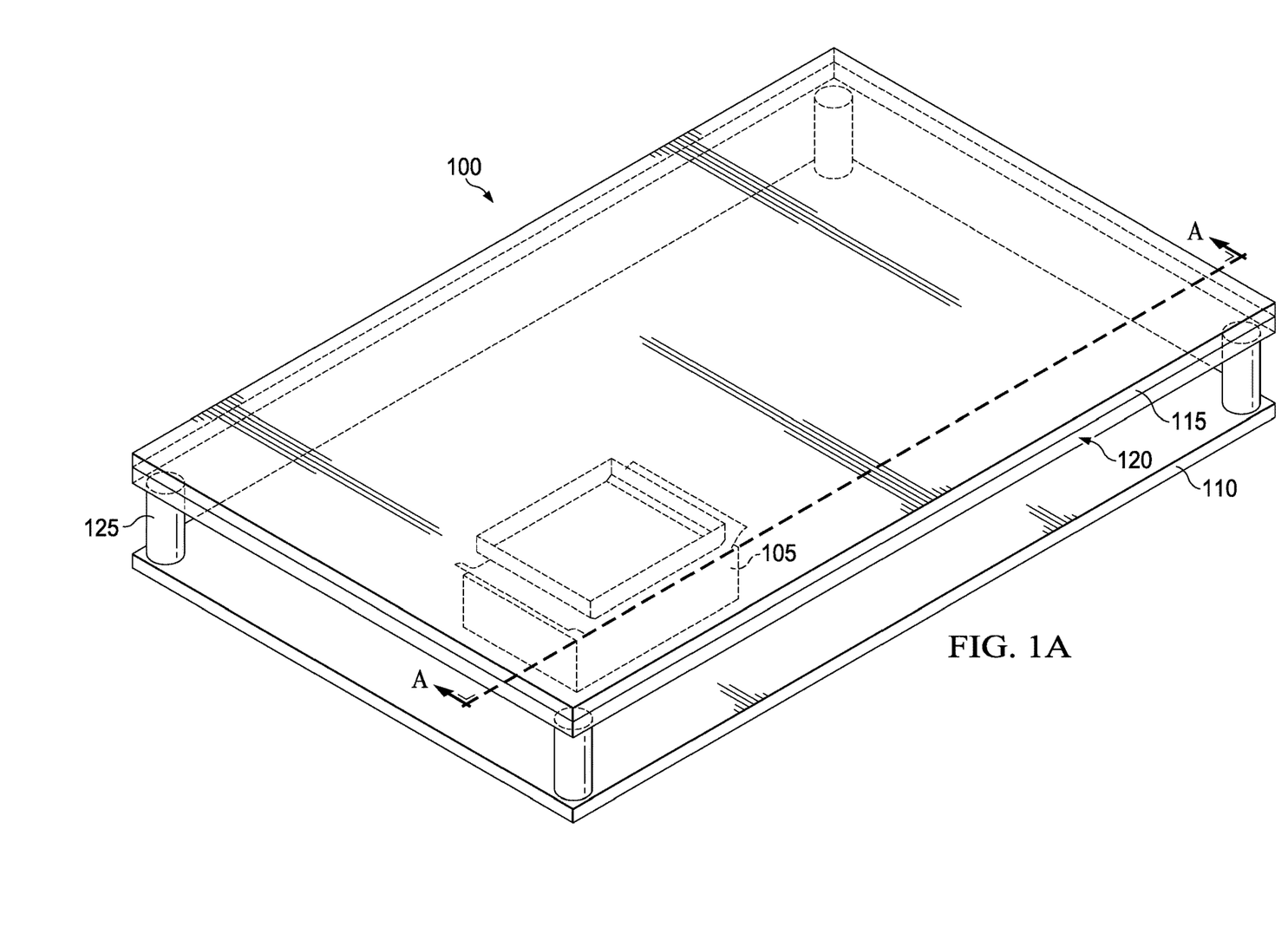
FIGS. 1A through 1C illustrate an example system that includes a composite spring heat spreader according to this disclosure.
Figure 1B:
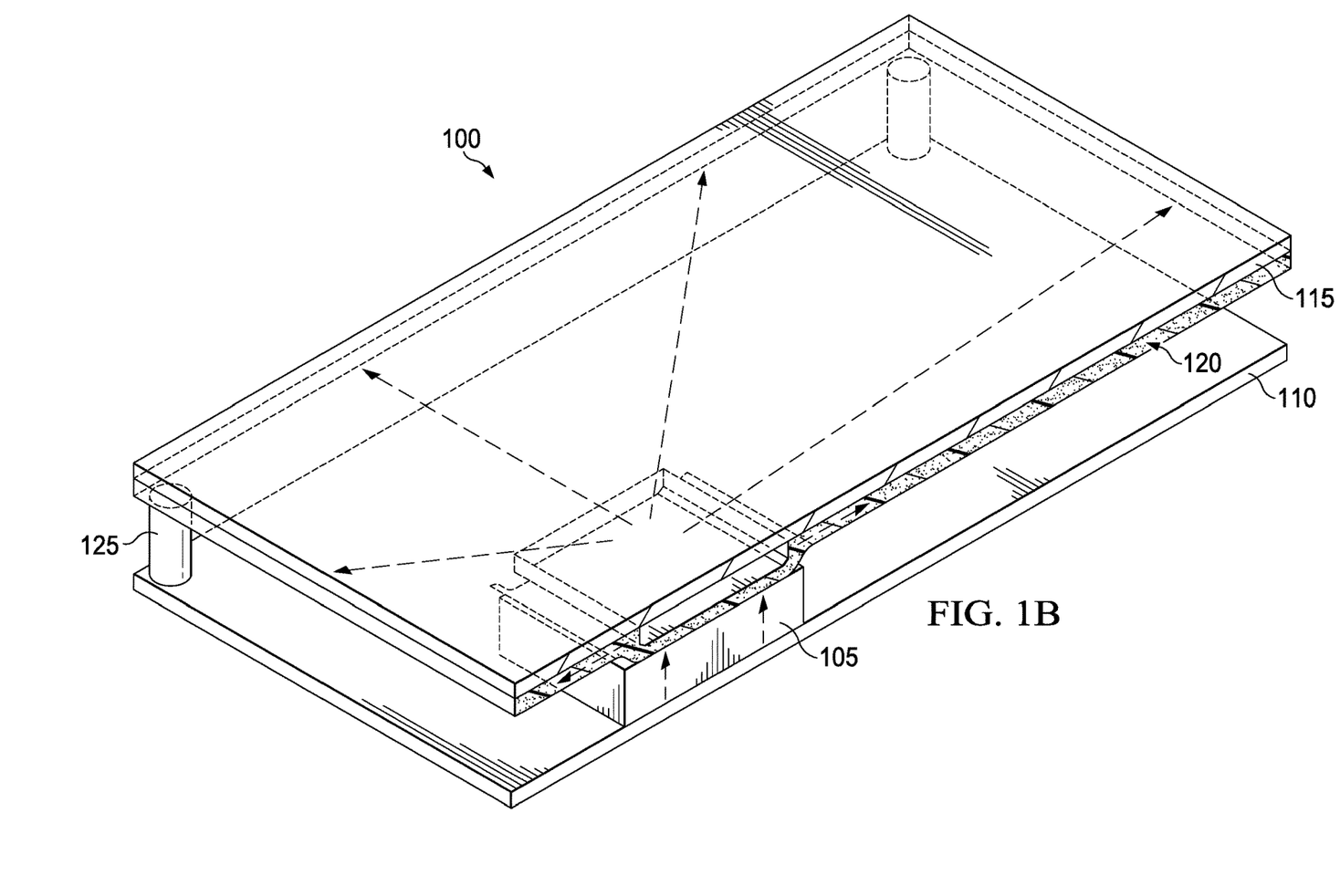
Figure 1C:
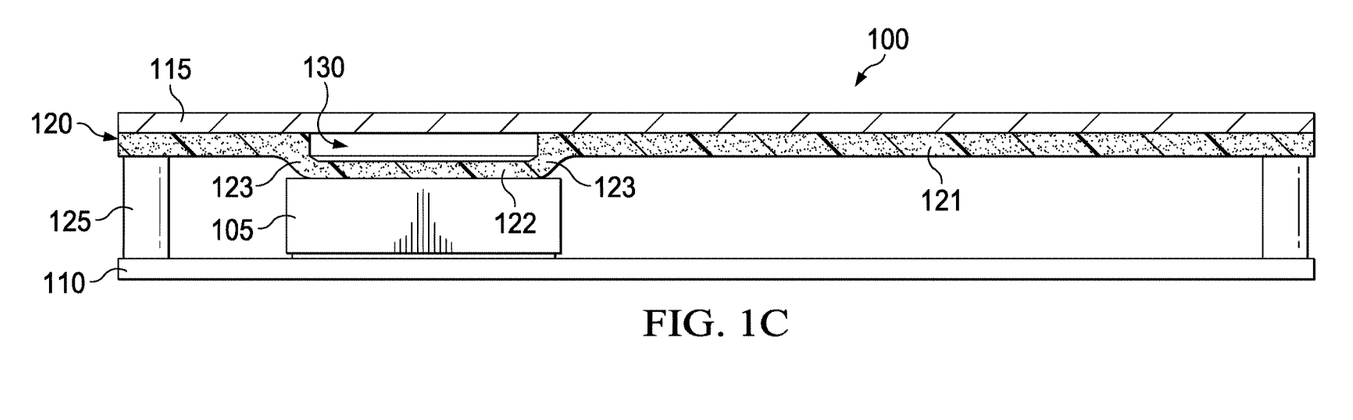

FIGS. 1A through 1C illustrate an example system 100 that includes a composite spring heat spreader according to this disclosure. In particular, FIG. 1A illustrates a perspective view of the system 100, FIG. 1B illustrates a perspective view of a cross-section of the system 100 taken along the line A-A in FIG. 1A, and FIG. 1C illustrates an elevation view of the same cross-section.

As shown in FIGS. 1A through 1C, the system 100 includes a heat generating component 105, a substrate 110, a heat sink 115, a heat spreader 120, and multiple spacers 125.

The heat generating component 105 represents any suitable device that consumes power and generates thermal energy or heat as a waste byproduct. In some embodiments, the heat generating component 105 is an electronic device, such as a computer processor chip. In some embodiments, the heat generating component 105 is generally rectangular and has a substantially flat top surface, upon which the heat spreader 120 can be placed to absorb and transfer heat away from the heat generating component 105. In some embodiments, the top surface of the heat generating component 105 may be generally rectangular and comprise an area of approximately 0.1-5.0 square inches, although other dimensions and shapes are possible and within the scope of this disclosure. In some embodiments, the heat generating component 105 may consume about 1 W-500 W of power, of which some is output in the form of heat; of course, other amounts of power consumption and heat generation are possible and within the scope of this disclosure.

The heat generating component 105 is disposed or mounted on the substrate 110, which can be a substantially planar substrate, such as a printed circuit board (although other configurations of substrate are possible and within the scope of this disclosure). As shown in FIG. 1A, the heat generating component 105 is disposed on an offset location of the substrate 110 such that the heat generating component 105 is closer to one of the spacers 125 than to the other spacers 125. This is merely one example placement; in other embodiments, the heat generating component 105 could be positioned at other locations around the surface of the substrate 110, including at a center location of the substrate 110 or closer to one or more edges of the substrate 110. In addition, more than one heat generating component 105 could be positioned on the substrate 110, as discussed in greater detail below. Other components (which may include one or more non-heat-generating components) can be disposed or mounted on the substrate 110, but are not shown for the sake of clarity.

The heat sink 115 is disposed above the heat generating component 105, and is provided to receive thermal energy from the heat generating component 105 via the heat spreader 120 (as discussed in greater detail below) and dissipate the thermal energy to surrounding areas. For example, the arrows shown in FIG. 1B show example directions of thermal energy transfer away from the heat generating component 105 and through the heat sink 115.

The heat sink 115 represents any suitable structure configured to receive and dissipate thermal energy using conduction, convection, radiation, or any combination of these. As shown in FIGS. 1A through 1C, the heat sink 115 is generally planar and is formed of a thermally conductive material, such as copper, aluminum, steel, a thermal composite, aligned crystalline graphite (such as MOMENTIVE TPG or BOYD APG), or the like. In some embodiments, the heat sink 115 includes a thermal ground plane (TGP). In some embodiments, the heat sink 115 may be approximately 2 inches by 3 inches, and approximately 0.005 inches thick. Of course, other dimensions and shapes are possible and within the scope of this disclosure.

The heat spreader 120 is a composite spring heat spreader with a high effective thermal conductivity (e.g., a thermal conductivity $K >= 750$ W/m–K). The heat spreader 120 is provided to receive thermal energy from the heat generating component 105 and transfer the thermal energy to the heat sink 115 through conduction.

As shown in FIG. 1C, the heat spreader 120 includes a first planar region 121, a second planar region 122, and multiple flexure regions 123. In some embodiments, each region 121-123 has a thickness of approximately 0.02 inches. The second planar region 122 is in a plane that is vertically offset from the first planar region 121 (i.e., offset in a Z direction perpendicular to the plane of the first planar region 121). In some embodiments, the offset is approximately 0.03 inches. Of course, other dimensions are possible and within the scope of this disclosure. Substantially all of the top surface of the first planar region 121 is in contact with the bottom surface of the heat sink 115, and substantially all of the bottom surface of the second planar region 122 is in contact with the top surface of the heat generating component 105. In some embodiments, a thin layer of thermal grease can be applied between the bottom surface of the second planar region 122 and the top surface of the heat generating component 105 to fill in surface imperfections and improve heat transfer efficiency. The flexure regions 123 thermally connect the first planar region 121 and the second planar region 122, resulting in a thermally integral path for transfer of thermal energy.

The flexure regions 123 are generally stiff but somewhat flexible, and can deform similar to leaf springs such that the vertical offset between the first planar region 121 and the second planar region 122 can be smaller or larger. The lower planar region 122 and the flexure regions 123 together form a spring-like region that exerts an increasing downward force on the heat generating component 105 as the heat spreader 120 is compressed between the heat generating component 105 and the heat sink 115. In some operational environments, the spring force should be strong enough to keep the components in contact with each other during periods of shock, vibration, or other movement, but should not be so strong that contact between components causes damage to fragile elements, such as solder joints and component cases.

To achieve high thermal conductivity and spring-like resistance to compressive forces, the heat spreader 120 includes a first material that exhibits high thermal conductivity and a second material that provides increased stiffness. In some embodiments, the first and second materials are bonded together to form an integral heat spreader structure. Further details of the heat spreader 120 and its component materials are provided below in conjunction with other figures.

As shown in FIG. 1C, the lower planar region 122 of the heat spreader 120 and the bottom surface of the heat sink 115 form a void region 130. In some embodiments, the void region 130 is simply a gap that contains ambient air or other gasses disposed around the system 100. In other embodiments, the void region 130 can be filled with another material, such as a thermally insulative material, another thermally conductive material, a gap pad, a gel, a spring component (such as a diametrically compressed composite tube), or any other suitable material. Because the void region 130 can expand or contract under force, any material placed in the void region 130 should be resilient.

The spacers 125 are provided in the system 100 to maintain a separation between the substrate 110 and the heat spreader 120. In the system 100, the spacers 125 may be approximately 0.2 inches in height. Use of the spacers 125 is merely one example for maintaining separation between components. In other embodiments, separation between components (which can be more or less than 0.2 inches) can be achieved in other manners, including one or more walls, support structures, and the like.

Although FIGS. 1A through 1C illustrate one example of a system 100 that incorporates a composite spring heat spreader, various changes may be made to FIGS. 1A through 1C. For example, various components in FIGS. 1A through 1C could be combined, further subdivided, or omitted and additional components could be added according to particular needs. As a particular example, the heat spreader could be in contact with multiple heat sinks or heat generating components. Moreover, while various references have been made to directions or spatial relationships (e.g., above, over, top, lower, and the like), these references are in relation to the orientation of components shown in FIGS. 1A through 1C. In other embodiments, these components could be oriented in other directions as needed or desired in other applications.

Figure 2:
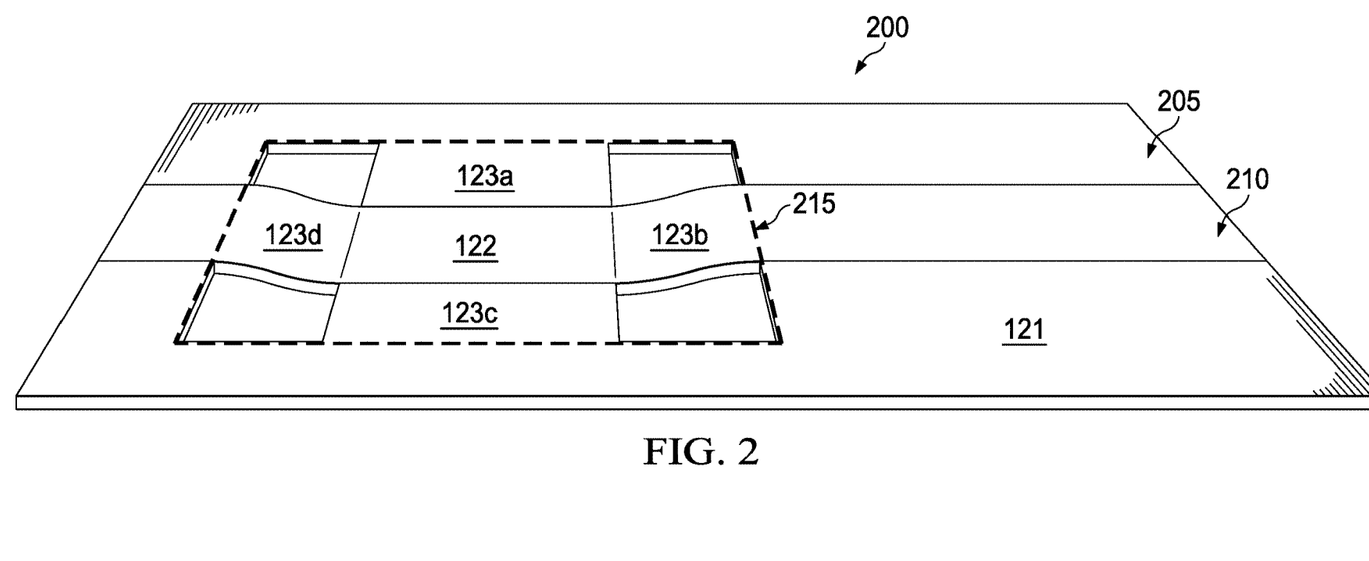
FIG. 2 illustrates an example composite spring heat spreader according to this disclosure.

FIG. 2 illustrates an example composite spring heat spreader 200 according to this disclosure. For ease of explanation, the heat spreader 200 is described as representing the heat spreader 120 and usable in the system 100 of FIGS. 1A through 1C. However, the heat spreader 200 shown in FIG. 2 could be used in any suitable system.

As shown in FIG. 2, the heat spreader 200 includes a first planar region 121, a second planar region 122, and multiple flexure regions 123, which are indicated as 123a-123d. The second planar region 122 and the flexure regions 123 are disposed within an opening 215 (generally indicated by the dashed lines) in the first planar region 121. Each region 121-123 may be approximately 0.02 inches thick. The flexure regions 123 are oriented at an angle (relative to the planes of the planar regions 121-122) or curved (such as in an S-curve shape) to achieve an offset between the first planar region 121 and the second planar region 122 of approximately 0.03 inches.

Similar to the heat spreader 120 of FIGS. 1A through 1C, the heat spreader 200 is formed of a first material 205 and a second material 210. The first material 205 is highly thermally conductive, in order to promote transfer of thermal energy from a heat generating component to a heat sink. In some embodiments, the first material 205 is a pyrolytic graphite sheet (e.g., PANASONIC PGS). Of course, this is merely one example; in other embodiments, the first material 205 can include one or more other suitable materials with high thermal conductivity and suitable flexibility.

Because PGS and some other thermally conductive materials are highly flexible (especially at a thickness of approximately 0.02 inches), the first material 205 may not be very stiff. Stated differently, the first material 205 may provide very little resistance force when bent or flexed. In order to maintain a desired amount of stiffness or "springiness" in the heat spreader 200, the second material 210 is formed of a high strain composite material, such as a carbon fiber reinforced epoxy or glass reinforced epoxy. Of course, epoxies are merely one example; in other embodiments, the second material 210 can include one or more other suitable materials with a stiffness that is much higher than that of the first material 205. The first material 205 and the second material 210 are bonded together using any suitable bonding method (e.g., adhesive(s), heat bonding, and the like) in order to form an integral heat spreader 200. The stiffness of the second material 210 controls the out-of-plane deflection of the second planar region 122. In some embodiments, the second material 210 allows the second planar region 122 to be able to flex approximately 0.015 inches "up" or "down" relative to the first planar region 121.

As shown in FIG. 2, the second planar region 122 has multiple edges, and one of the multiple flexure regions 123a-123d connects each of the multiple edges to the first planar region 121. To provide the desired stiffness to the heat spreader 200, the second material 210 is formed to extend across the first planar region 121, two flexure regions 123b and 123d, and the second planar region 122. In other embodiments, the second material 210 may be formed in other or additional locations on the heat spreader 200, such as across the other flexure regions 123a and 123c, or other portions of the first planar region 121.

In general, the second material 210 and its quantity and placement within the heat spreader 200 can be selected to achieve a desired stiffness and compressibility for the heat spreader 200, such that the spring forces generated when the heat spreader 200 is compressed are sufficient to maintain contact between components during periods of shock, vibration, or other movement, without causing damage to fragile elements. Moreover, the length and angle or curve of the flexure regions 123 may be tailored to accommodate different assembly tolerances and nominal gaps between components.

Although FIG. 2 illustrates one example of a composite spring heat spreader 200, various changes may be made to FIG. 2. For example, various components in FIG. 2 could be combined, further subdivided, or omitted and additional components could be added according to particular needs. As another example, the sizes of the opening 215 and the second planar region 122 could be larger or smaller, depending on the size of the heat generating component to be cooled and the amount of deflection required between the first planar region 121 and the second planar region 122.

Figure 3A:
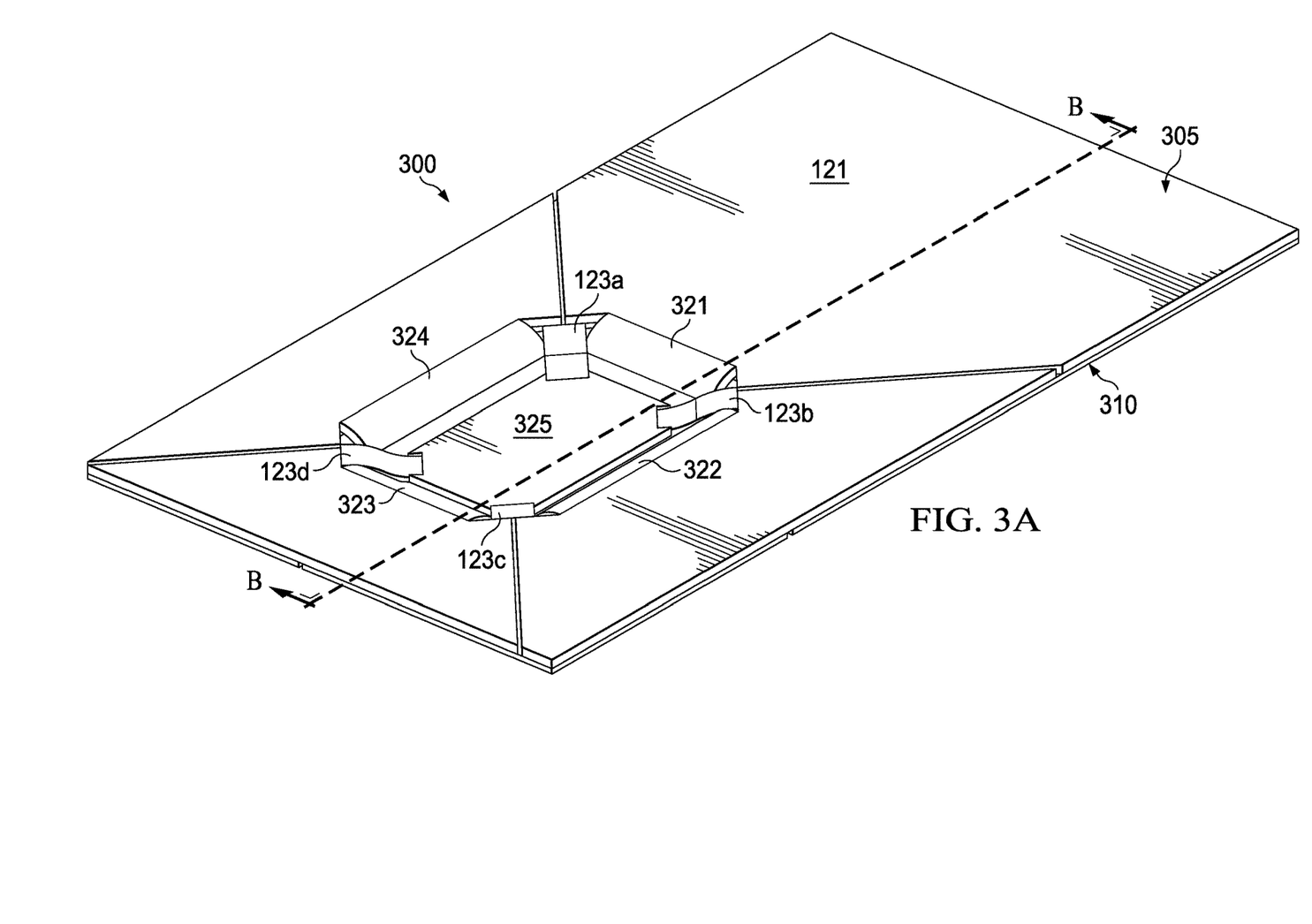
FIGS. 3A through 3D illustrate another example composite spring heat spreader according to this disclosure.
Figure 3B:
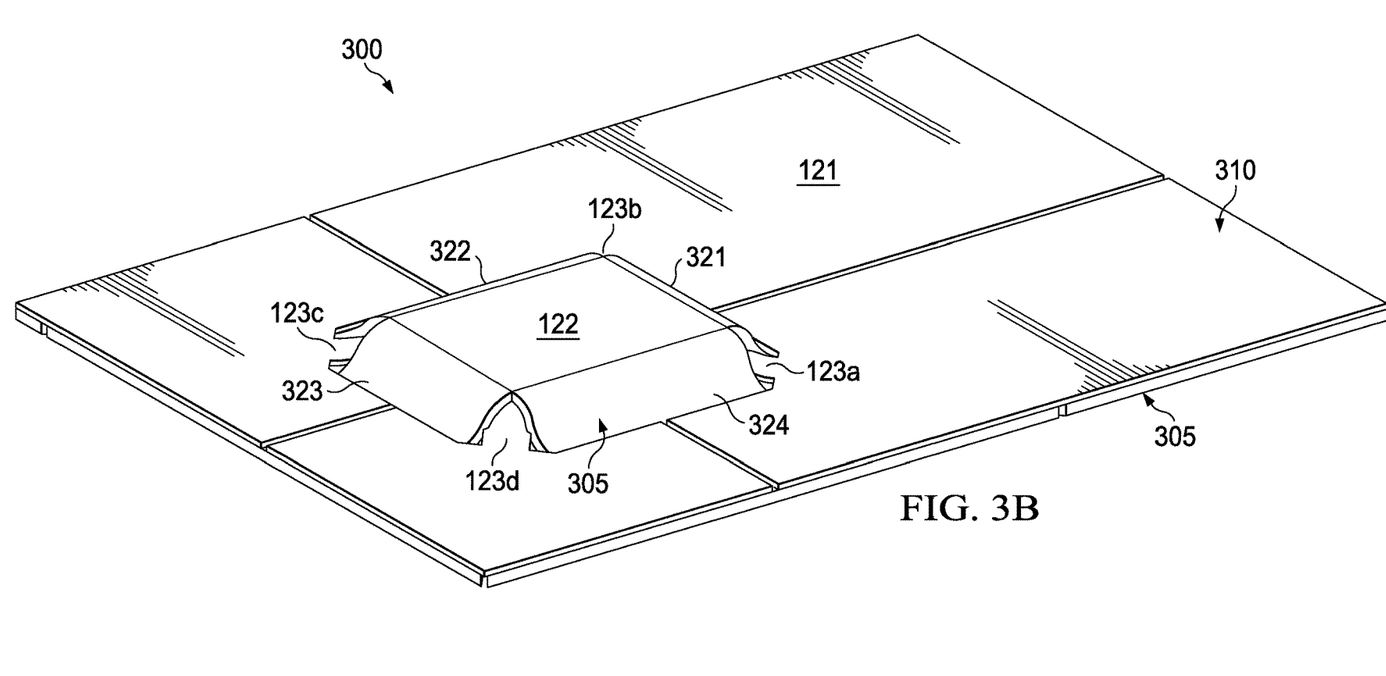
Figure 3C:
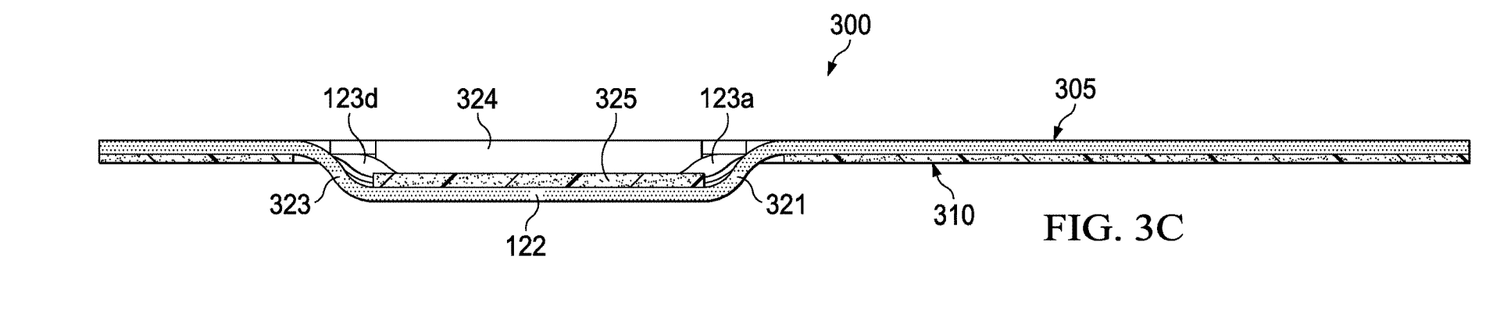
Figure 3D:
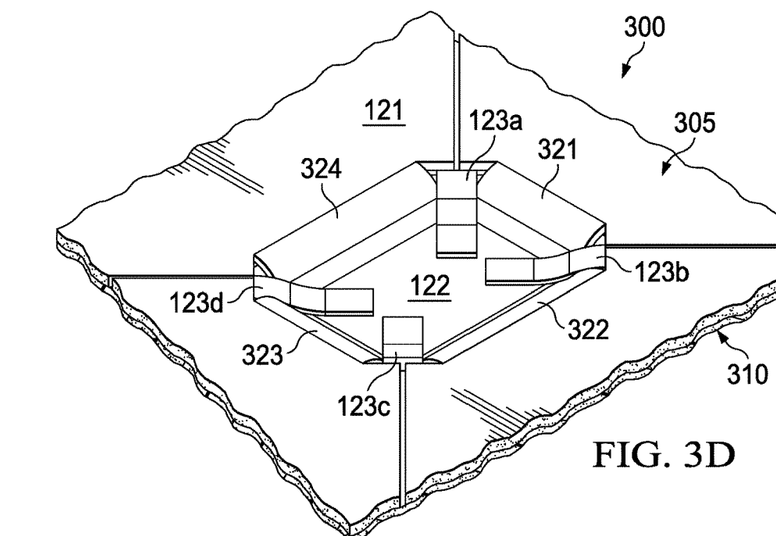

FIGS. 3A through 3B illustrate another example composite spring heat spreader 300 according to this disclosure. In particular, FIG. 3A illustrates a perspective view of the "top" side of the heat spreader 300, FIG. 3B illustrates a perspective view of the "bottom" side of the heat spreader 300, FIG. 3C illustrates a cross-section view of the heat spreader 300 taken along the line B-B in FIG. 3A, and FIG. 3D illustrates a perspective view of a portion of the top side of the heat spreader 300 in which a component has been removed, as discussed below. For ease of explanation, the heat spreader 300 is described as representing the heat spreader 120 and usable in the system 100 of FIGS. 1A through 1C. However, the heat spreader 300 shown in FIGS. 3A through 3D could be used in any suitable system.

As shown in FIGS. 3A through 3D, the heat spreader 300 includes a first planar region 121, a second planar region 122, and multiple flexure regions 123, which are indicated as 123a-123d. The flexure regions 123a-123d are oriented at an angle (relative to the planes of the planar regions 121-122) or curved (such as in an S-curve shape) to achieve an offset between the first planar region 121 and the second planar region 122.

Similar to the heat spreaders 120 and 200, the heat spreader 300 is formed of a first material 305 that is highly thermally conductive, and a second material 310 that provides stiffness to the heat spreader 300. In some embodiments, the first material 305 is PGS and the second material 310 is a fiber reinforced epoxy, but any other suitable materials can be used.

In the first planar region 121, the first material 305 is formed in a layer above the second material 310, as indicated in the views shown in FIGS. 3A through 3D. This is so the thermally conductive first material 305 makes contact with a heat sink (not shown) all across the first planar region 121 when the heat spreader 300 and the heat sink are brought together. In the second planar region 122, the order is reversed such that the first material 305 is formed in a layer below the second material 310. This is so the thermally conductive first material 305 makes maximum contact with a heat generating component (not shown) when the heat spreader 300 and the heat generating component are brought together.

In some embodiments, a reinforcement plate 325 is coupled to the top surface of the second planar region 122, as shown in FIGS. 3A and 3C. The reinforcement plate 325 provides a flat surface to press the first material 305 against the heat generating component. In FIG. 3D, the reinforcement plate 325 has been removed from the drawing to show the underlying second planar region 122 and the end portions of the flexure regions 123a-123d. While not explicitly shown, such a reinforcement plate could also be used with the heat spreader 200 of FIG. 2.

The flexure regions 123a-123d are formed of the stiff second material 310 in order to provide the desired stiffness to the heat spreader 300. To provide an unified, uninterrupted heat transfer path, the first material 305 in the first planar region 121 is connected to the first material 305 in the second planar region 122 by multiple connecting portions 321-324 formed of the first material 305. Because the first material 305 is not very resistant to bending and flexing, the connecting portions 321-324 provide little stiffness to the heat spreader 300.

Although FIGS. 3A through 3D illustrate one example of a composite spring heat spreader 300, various changes may be made to FIGS. 3A through 3D. For example, various components in the figures could be combined, further subdivided, or omitted and additional components could be added according to particular needs. As another example, the size of the second planar region 122 could be larger or smaller, depending on the size of the heat generating component to be cooled.

Figure 4:
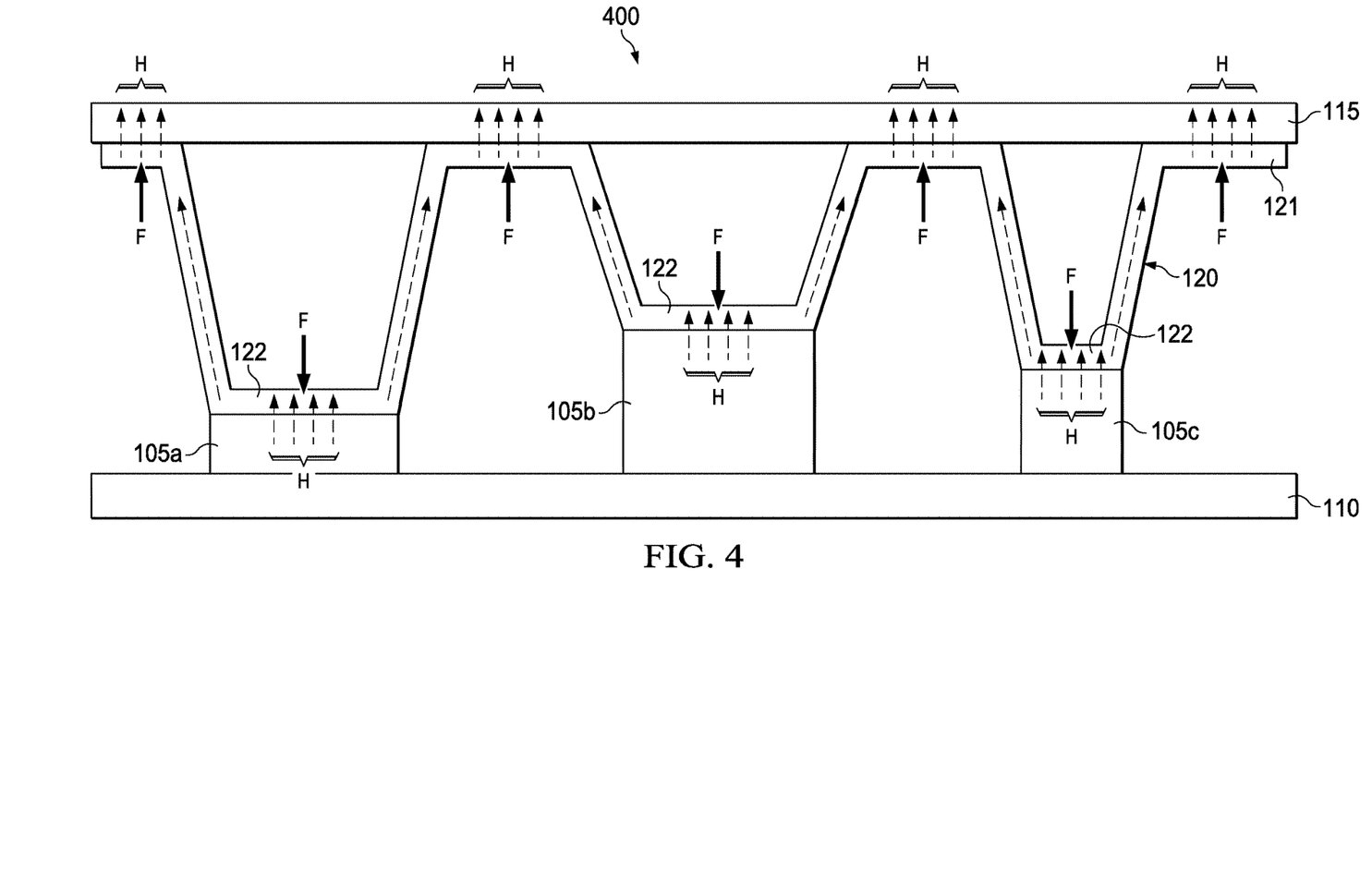
FIG. 4 illustrates another example system that includes a composite spring heat spreader according to this disclosure.

FIG. 4 illustrates another example system 400 that includes a composite spring heat spreader according to this disclosure. As shown in FIG. 4, the system 400 includes a number of components that are the same as or similar to corresponding components of the system 100 of FIGS. 1A through 1C. For example, the system 400 includes a heat spreader 120, which can represent the heat spreader 200 of FIG. 2, the heat spreader 300 of FIG. 3, or any other suitable heat spreader. However, instead of one heat generating component 105, the system 400 includes multiple heat generating components 105a-105c disposed on a substrate 110.

As shown in FIG. 4, the heat spreader 120 has multiple second planar regions 122, where each second planar region 122 is configured to contact the top surface of a corresponding one of the heat generating components 105a-105c. As shown in FIG. 4, the heat generating components 105a-105c have different heights. That is, the height of the heat generating component 105c is greater that the height of the heat generating component 105a but less than the height of the heat generating component 105b. To accommodate the different heights of the heat generating components 105a-105c, the second planar regions 122 of the heat spreader 120 are configured with different vertical offsets from the first planar region 121. This arrangement is useful for cooling heat generating components having different sizes and heights.

FIG. 4 also illustrates the mechanical spring forces (represented by arrows labeled 'F') that are exerted by the heat spreader 120 on the heat generating components 105a-105c and the heat sink 115. As discussed above, the spring forces should be sufficient to maintain contact between components during periods of shock, vibration, or other movement, without causing damage to fragile elements. In addition, FIG. 4 illustrates heat transfer paths (represented by arrows labeled 'H') from the heat generating components 105a-105c, through the heat spreader 120, and into the heat sink 115.

Although FIG. 4 illustrates one example of a system 400 that incorporates a composite spring heat spreader, various changes may be made to FIG. 4. For example, various components in FIG. 4 could be combined, further subdivided, or omitted and additional components could be added according to particular needs. As a particular example, while FIG. 4 shows three heat generating components 105a-105c, other embodiments could include more or fewer than three heat generating components.

Figure 5:
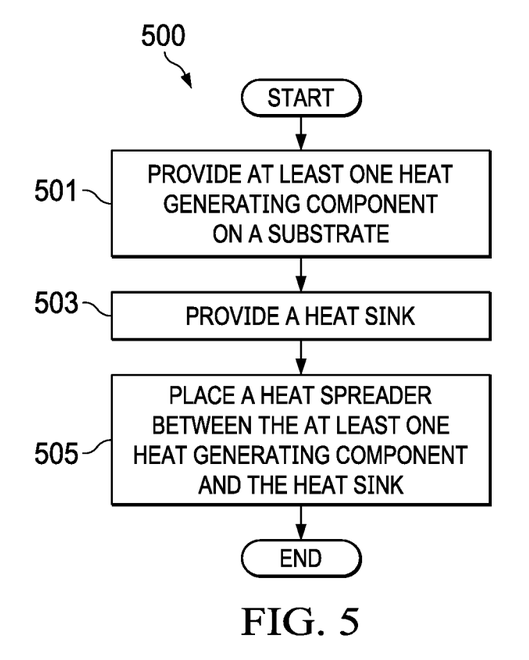
FIG. 5 illustrates an example method for assembling a system that includes a composite spring heat spreader according to this disclosure.

FIG. 5 illustrates an example method 500 for assembling a system that includes a composite spring heat spreader according to this disclosure. For ease of explanation, the method 500 is described as involving the system 100 of FIGS. 1A through 1C. However, the method 500 could be used with any other suitable device or system.

At step 501, at least one heat generating component is provided on a substrate. This may include, for example, at least one heat generating component 105 being installed, fastened, or otherwise attached to the substrate 110.

At step 503, a heat sink is provided. This may include, for example, obtaining the heat sink 115 for use in the system 100.

At step 505, a heat spreader is placed between the heat generating component and the heat sink. This may include, for example, positioning the second planar region 122 of the heat spreader 120 to be in contact with the heat generating component 105, and positioning the first planar region 121 of the heat spreader 120 to be in contact with the heat sink 115, such as shown in FIG. 1C. In some embodiments, a thin layer of thermal grease can be applied between the heat spreader 120 and the heat generating component 105 to fill in surface imperfections and improve heat transfer efficiency. A suitable compressive force can be applied to the components to ensure uninterrupted contact between the components during periods of vibration or shock in the system 100.

Although FIG. 5 illustrates one example of a method 500 for assembling a system that includes a composite spring heat spreader, various changes may be made to FIG. 5. For example, while shown as a series of steps, various steps shown in FIG. 5 could overlap, occur in parallel, occur in a different order, or occur multiple times. Moreover, some steps could be combined or removed and additional steps could be added according to particular needs.

The embodiments disclosed herein provide a composite spring heat spreader that has multiple advantages over other heat spreading structures, such as gap pads. As described above, the disclosed heat spreader can be tailored to provide a desired exertion force on heat generating components that maintains contact between components without damaging fragile elements. In contrast, pressure sensitive components can easily be over-compressed by a gap pad. In addition, the disclosed embodiments enable the use of a thin layer of high performance, non-compliant thermal grease between the heat spreader and the heat generating component to fill in surface imperfections and improve heat transfer efficiency.

In addition, the dimensions, angles, and curves of the disclosed heat spreader can be selected to accommodate any nominal gap and still absorb large assembly tolerances, while maintaining good thermal performance. Since the length of the thermal path between the heat generating component and the heat sink is fixed, the thermal performance is unchanged as the heat spreader absorbs any assembly tolerances. Thus, thermal performance of the heat spreader is independent of tolerance stack up. This is important for high heat flux designs. In contrast, traditional gap pads can have a large range of thermal performance due to assembly stack up tolerances.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a first planar region having a first surface configured to contact a heat sink;
at least one second planar region having a second surface configured to contact a surface of at least one electronic device, the at least one second planar region being parallel to the first planar region and disposed in at least one plane that is offset from the first planar region; and
a plurality of flexure regions disposed at an angle or curved relative to the first planar region and the at least one second planar region, the plurality of flexure regions connecting the at least one second planar region to the first planar region,
wherein the first planar region and the at least one second planar region are formed of at least a thermally conductive material and a stiffening material and the plurality of flexure regions are formed of at least the stiffening material; and wherein the thermally conductive material is above the stiffening material in the first planar region and the stiffening material is above the thermally conductive material in the at least one second planar region.

2. The apparatus of claim 1, wherein the first planar region has at least one opening corresponding to a location of the at least one second planar region and the flexure regions.

3. The apparatus of claim 2, wherein:
the at least one second planar region comprises multiple second planar regions;
the plurality of flexure regions comprises multiple flexure regions for each of the second planar regions; and
the at least one opening comprises multiple openings, each opening corresponding to one of the second planar regions.

4. The apparatus of claim 3, wherein at least one of the multiple second planar regions is disposed in a plane that is different than a plane in which another of the multiple second planar regions is disposed.

5. The apparatus of claim 1, wherein the at least one second planar region comprises multiple edges, and the plurality of flexure regions comprises a flexure region connecting each of the multiple edges to the first planar region.

6. The apparatus of claim 1, wherein:
the thermally conductive material comprises a pyrolytic graphite sheet; and
the stiffening material comprises a carbon fiber or glass reinforced epoxy.

7. The apparatus of claim 1, further comprising:
a reinforcement plate disposed over the at least one second planar region.

8. A system comprising:
at least one electronic device;
a heat sink; and
a heat spreader disposed between the at least one electronic device and the heat sink, the heat spreader comprising:
a first planar region having a first surface configured to contact the heat sink;
at least one second planar region having a second surface configured to contact a surface of the at least one electronic device, the at least one second planar region being parallel to the first planar region and disposed in at least one plane that is offset from the first planar region; and
a plurality of flexure regions disposed at an angle or curved relative to the first planar region and the at least one second planar region, the plurality of flexure regions connecting the at least one second planar region to the first planar region,
wherein the first planar region and the at least one second planar region are formed of at least a thermally conductive material and a stiffening material and the plurality of flexure regions are formed of at least the stiffening material; and
wherein the thermally conductive material is above the stiffening material in the first planar region and the stiffening material is above the thermally conductive material in the at least one second planar region.

9. The system of claim 8, wherein the first planar region has at least one opening corresponding to a location of the at least one second planar region and the flexure regions.

10. The system of claim 9, wherein:
the at least one second planar region comprises multiple second planar regions;
the plurality of flexure regions comprises multiple flexure regions for each of the second planar regions; and
the at least one opening comprises multiple openings, each opening corresponding to one of the second planar regions.

11. The system of claim 10, wherein at least one of the multiple second planar regions is disposed in a plane that is different than a plane in which another of the multiple second planar regions is disposed.

12. The system of claim 8, wherein the at least one second planar region comprises multiple edges, and the plurality of flexure regions comprises a flexure region connecting each of the multiple edges to the first planar region.

13. The system of claim 8, wherein:
the thermally conductive material comprises a pyrolytic graphite sheet; and
the stiffening material comprises a carbon fiber or glass reinforced epoxy.

14. The system of claim 8, wherein the heat spreader further comprises:
a reinforcement plate disposed over the at least one second planar region.

15. The system of claim 8, further comprising:
a substrate, wherein the at least one electronic device is disposed on the substrate.

16. A method comprising:
providing at least one electronic device on a substrate;
providing a heat sink; and
placing a heat spreader between the at least one electronic device and the heat sink, the heat spreader comprising:
a first planar region having a first surface contacting the heat sink;
at least one second planar region having a second surface contacting a surface of the at least one electronic device, the at least one second planar region being parallel to the first planar region and disposed in at least one plane that is offset from the first planar region; and
a plurality of flexure regions disposed at an angle or curved relative to the first planar region and the at least one second planar region, the plurality of flexure regions connecting the at least one second planar region to the first planar region,
wherein the first planar region and the at least one second planar region are formed of at least a thermally conductive material and a stiffening material and the plurality of flexure regions are formed of at least the stiffening material; and
wherein the thermally conductive material is above the stiffening material in the first planar region and the stiffening material is above the thermally conductive material in the at least one second planar region.

17. The method of claim 16, wherein the first planar region has at least one opening corresponding to a location of the at least one second planar region and the flexure regions.

18. The method of claim 17, wherein:
the at least one second planar region comprises multiple second planar regions;
the plurality of flexure regions comprises multiple flexure regions for each of the second planar regions; and
the at least one opening comprises multiple openings, each opening corresponding to one of the second planar regions.

19. The method of claim 18, wherein at least one of the multiple second planar regions is disposed in a plane that is different than a plane in which another of the multiple second planar regions is disposed.

20. The method of claim 16, wherein:
the thermally conductive material comprises a pyrolytic graphite sheet; and
the stiffening material comprises a carbon fiber or glass reinforced epoxy.

* * * * *